US010622065B2

(12) United States Patent
Balluchi et al.

(10) Patent No.: US 10,622,065 B2
(45) Date of Patent: Apr. 14, 2020

(54) DEDICATED COMMANDS FOR MEMORY OPERATIONS

(71) Applicant: Micron Technology, Inc., Boise, ID (US)

(72) Inventors: Daniele Balluchi, Cernusco sul Naviglio (IT); Paolo Amato, Treviglio (IT); Graziano Mirichigni, Vimercate (IT); Danilo Caraccio, Milan (IT); Marco Sforzin, Cernusco sul Naviglio (IT); Marco Dallabora, Melegnano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/128,550

(22) Filed: Sep. 12, 2018

(65) Prior Publication Data

US 2020/0082883 A1 Mar. 12, 2020

(51) Int. Cl.
*G11C 13/00* (2006.01)
*G11C 8/12* (2006.01)
*G11C 11/56* (2006.01)

(52) U.S. Cl.
CPC .......... *G11C 13/0069* (2013.01); *G11C 8/12* (2013.01); *G11C 13/0033* (2013.01); *G11C 13/0097* (2013.01); *G11C 11/5678* (2013.01); *G11C 2213/70* (2013.01)

(58) Field of Classification Search
None
See application file for complete search history.

(56) References Cited

U.S. PATENT DOCUMENTS

| 7,522,470 | B2* | 4/2009 | Asauchi | G06F 21/6218 |
| | | | | 365/189.011 |
| 9,202,564 | B2 | 12/2015 | Minemura et al. | |
| 9,437,290 | B2 | 9/2016 | Lee et al. | |
| 9,734,908 | B1 | 8/2017 | Frederick | |
| 2006/0077740 | A1 | 4/2006 | Lee et al. | |
| 2007/0280031 | A1* | 12/2007 | Maejima | G11C 7/02 |
| | | | | 365/230.06 |
| 2009/0161408 | A1* | 6/2009 | Tanigami | G11C 13/0007 |
| | | | | 365/148 |

(Continued)

OTHER PUBLICATIONS

International Search Report & Written Opinion from related International Application No. PCT/US2019/048470, dated Dec. 17, 2019, 11 pages.

*Primary Examiner* — Tan T. Nguyen
(74) *Attorney, Agent, or Firm* — Brooks, Cameron & Huebsch, PLLC

(57) ABSTRACT

An apparatus can have a memory comprising an array of resistance variable memory cells and a controller. The controller can be configured to receive to a dedicated command to write all cells in a number of groups of the resistance variable memory cells to a first state without transferring any host data corresponding to the first state to the number of groups. The controller can be configured to, in response to the dedicated command, perform a read operation on each respective group to determine states of the cells in each respective group, determine from the read operation any cells in each respective group programmed to a second state, and write only the cells determined to be in the second state to the first state.

27 Claims, 4 Drawing Sheets

(56) References Cited

U.S. PATENT DOCUMENTS

| | | |
|---|---|---|
| 2012/0137047 A1 | 5/2012 | Hars et al. |
| 2016/0232971 A1 | 8/2016 | Yoon et al. |
| 2017/0052739 A1* | 2/2017 | Terada .................. G06F 3/0613 |
| 2017/0365323 A1 | 12/2017 | Calderoni et al. |
| 2018/0025777 A1 | 1/2018 | Jacobvitz |
| 2018/0217773 A1 | 8/2018 | Siciliani et al. |

* cited by examiner

DEDICATED COMMANDS FOR MEMORY OPERATIONS

TECHNICAL FIELD

The present disclosure relates generally to apparatus, such as memory systems, and their operation, and, more particularly, to dedicated commands for memory operations.

BACKGROUND

Memory systems, such as storage systems, may be implemented in electronic systems, such as computers, cell phones, hand-held electronic devices, etc. Some storage systems, such as solid state drives (SSDs), embedded Multi-Media Controller (eMMC) devices, Universal Flash Storage (UFS) devices, and the like may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), resistive random access memory (RRAM), ferroelectric random access memory (FeRAM), magnetoresistive random access memory (MRAM), and programmable conductive memory, among other types of memory.

Resistance variable memory cells can be written (e.g., programmed) to a desired state, such as to one of multiple states. For example, each of the respective multiples states can correspond to a respective threshold voltage (Vt) distribution. A resistance variable memory cell programmed as a single level cell (SLC) can store one of two logical (e.g., binary) data states (e.g., 1 or 0). A resistance variable memory cell programmed as a multi-level cell (MLC) can store more than two logical data states. For example, a resistance variable quad-level cell can be programmed to store one of 16 states, such as 1111, 0111, 0011, 1011, 1001, 0001, 0101, 1101, 1100, 0100, 0000, 1000, 1010, 0010, 0110, and 1110.

The respective states (e.g., stored data values) of resistance variable memory cells depend on the respective programmed resistances of the memory cells corresponding to respective Vts of the cells. Resistance variable memory cells can be rewritten by overwriting them without first erasing them, in some examples. This can be referred to as writing in place. The state of the resistance variable memory cell can be determined (e.g., read), for example, by sensing current through the cell responsive to an applied sensing (e.g., a read) voltage. The sensed current, which varies based on the resistance of the cell, can indicate the state of the cell, such as the logical data value stored by the cell. However, the resistance of a programmed resistance variable memory cell can drift (e.g., shift) over time. Resistance drift can result in erroneous sensing of a resistance variable memory cell (e.g., a determination that the cell is in a state other than that to which it was programmed), among other issues.

In some examples a resistance variable cell in a lower resistance state can be said to be in a set state (e.g., corresponding to a logical 1), and a resistance variable cell in a higher resistance state can be said to be in a reset state (e.g., corresponding to a logical 0). For example, a cell in the set state can be written in place (e.g., reset) to a reset state by a reset operation, and a cell in the reset state can be written in place (e.g., set) to a set state by a set operation.

DETAILED DESCRIPTION

Figure 1:
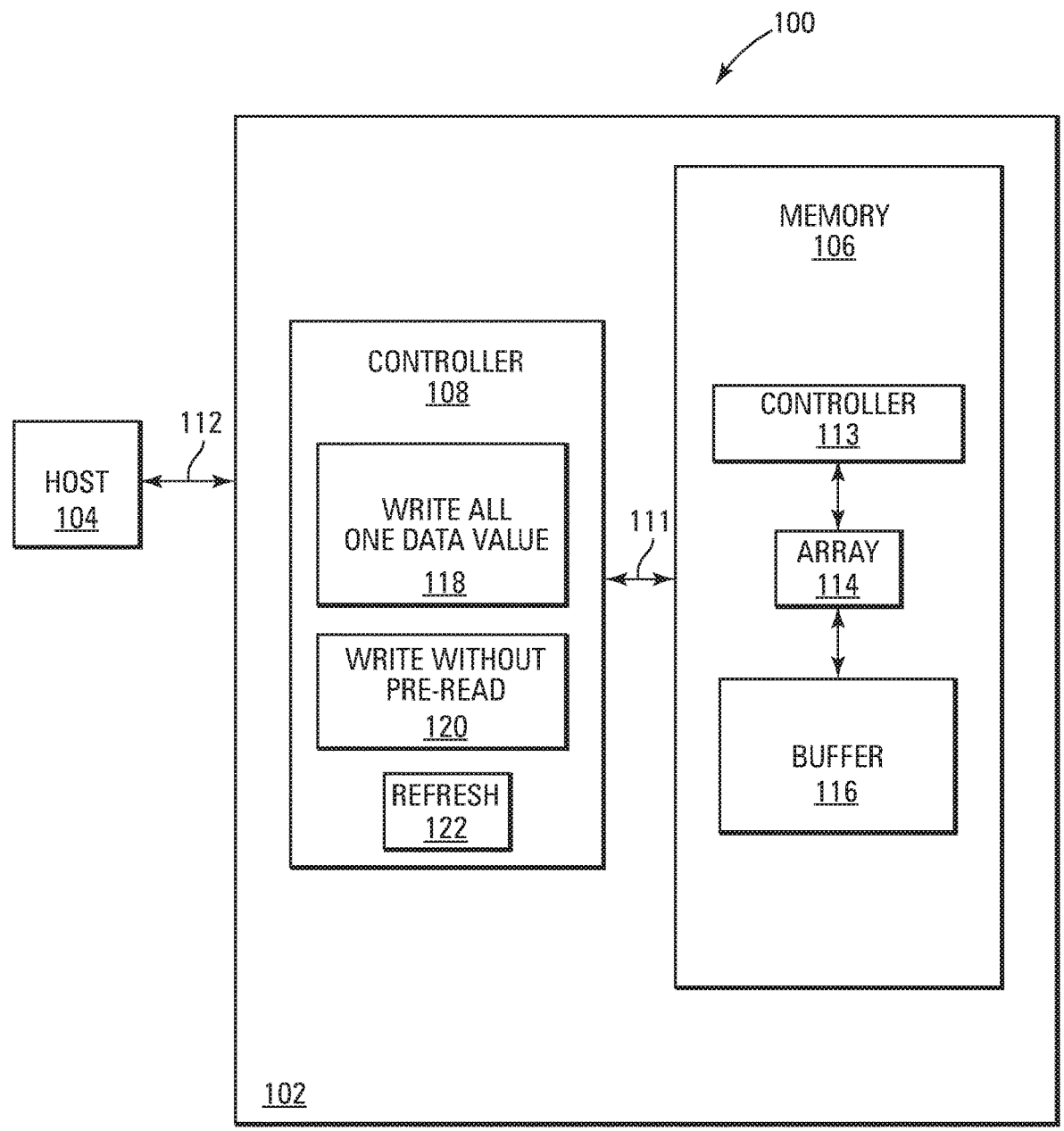
FIG. 1 is a block diagram of an apparatus, in accordance with a number of embodiments of the present disclosure.

The present disclosure is directed to technological improvements in apparatus and to methods (e.g., processes) performed by the apparatus, such as technological improvements to memory systems and their operation. In some embodiments, a number of groups of resistance variable memory cells can be written to a common resistance state without transferring any host data corresponding to the common resistance state to the cells. For example, a controller internal to a memory can write the cells to the common state internal to the memory in response to only receiving a dedicated command from a controller external to the memory without receiving the host data at the cells in response to the dedicated command. Writing the groups of memory cells to a common resistance state, such as a reset state corresponding to logical (e.g., binary) zeros (0s), can provide benefits such as reducing erroneous reading of resistance variable memory cells, whose resistance level can drift over time (e.g., after being programmed to a target state).

In previous approaches, the groups of memory cells can be written to a common resistance state by transferring host data corresponding to the common resistance state from the external controller to the memory over a data bus and writing the host data to the cells. However, such data transfers can consume power and/or data bus bandwidth. Embodiments of the present disclosure can reduce the power consumption and preserve the data bus width associated with such data transfers by writing the cells to the common resistance state internal to the memory in response to receiving a dedicated command from the external controller without receiving the host data corresponding to common resistance from the external controller. This can result in technological improvements to memory systems and their operation.

In some embodiments, host data from the external controller can be written to a target group of memory cells previously written to a common resistance state in response to a dedicated write without pre-read command from the external controller. For example, the data can be written to the target group without first reading the target group. This can result in technological improvements to memory systems and their operation by reducing the latency and energy consumption associated with executing a write command that involves reading the group of memory cells before writing to the group, as is commonly done in previous approaches.

In some of the disclosed embodiments, memory cells in a number of groups of memory cells that are written to a particular resistance state, such as a set state, corresponding to a particular data value, such as a logical one (1), can be refreshed (e.g., periodically) by writing the cells back to the particular resistance state internal to a memory in response to receiving a dedicated refresh command from the external controller without receiving any host data from the external controller that corresponds to the particular resistance state in response to the refresh command.

Different cells written to the particular resistance state, corresponding to the particular data value, at different times can drift over time to different resistance states corresponding to the same particular data value. This can make it difficult to read the different memory cells with a particular read voltage, and the read voltage might need to be adjusted, as is typically done in previous approaches. Refreshing the cells that have been written at different times back to the particular resistance state periodically can mitigate the problems associated with drift, such as potentially eliminating the need to adjust the read voltages.

Refreshing the cells without transferring any host data corresponding to the data to be refreshed from the external controller can reduce the power consumption and preserve the data bus width associated with such data transfers by refreshing the cells internal to the memory in response to receiving the dedicated refresh command from the external controller without receiving the host data from the external controller. This can result in technological improvements to memory systems and their operation.

FIG. 1 is a block diagram of an apparatus in the form of a computing system 100, in accordance with a number of embodiments of the present disclosure. Computing system 100 includes a memory system 102 that can be, for example, a storage system such as an SSD, a UFS device, an eMMC device, etc. However, embodiments are not limited to a particular type of memory system. For example, memory system 102 could serve as main memory for system 100.

As shown in FIG. 1, memory system 102 can include a controller 108 that may be referred to as a memory system controller, in that controller 108 can control a memory 106. Controller 108 is coupled a host 104 and to memory 106. For example, memory 106 can include a number of memory devices (e.g., dies, chips, etc.) and serve as a memory (e.g., main memory) and/or as a storage volume for system 102. Memory 106 can be coupled to controller 108 via an interface 111 (e.g., memory interface) that can include a data bus and that can support various standards and/or comply with various interface types, such as double data rate (DDR), etc. Controller 108 can receive commands, such as read and write commands from host 104. Controller 108 can, for example, receive data (e.g., user data) to be written to memory 106. The data can be received from a host 104 (e.g., via a host interface 112) and can be referred to as host data.

Host 104 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 104 can include one or more processors capable of accessing memory 106 (e.g., via controller 108) over interface 112 that can include a bus. Interface 112 may be a standardized interface, such as a serial advanced technology attachment (SATA), peripheral component interconnect express (PCIe), or a universal serial bus (USB), among various others.

Memory 106 can include a number of memory arrays 114 (e.g., referred to collectively as array 114) and a controller 113 that may be referred to as an embedded controller. In some examples, array 114 can include 2D and/or 3D array structures such as cross point array structures. For example, array 114 can include, for example, non-volatile resistance variable memory cells.

Controller 113 can be located internal to the memory 106, and can receive commands (e.g., write commands, read commands, refresh commands, etc.) from the controller 108 via the memory interface 111. For example, controller 113 can receive a dedicated write all one data value command 118, such as a write all logical zeros (0s) command, a dedicated write without pre-read command 120, and a dedicated refresh command 122 from controller 108, in accordance with a number of embodiments of the present disclosure. A data buffer 116 can be coupled to array 114. For example, data can be read from array 114 into buffer 116, or host data can be received at buffer 116 from controller 108 and subsequently written to array 114.

Memory array 114 can be divided into addressable groups of memory cells that can be written to (e.g., programmed) in response to write commands that address the groups and that can be read in response to read commands that address the groups. In some examples, the groups of memory cells can have a physical address that corresponds to a logical address received from host 104. Controller 108 can include a mapping table, such as logical-to-physical (L2P) mapping table, that can map the logical addresses from host 104 to the physical addresses of the groups of memory cells. The groups of memory cells can be pages corresponding logical addresses. In some examples, each group can store a data pattern that can be referred to as a management unit, such as a codeword.

In response to command 118, controller 113 can write all the memory cells in groups of memory cells in array 114 specified in command 118 to a data state corresponding to a data value specified in command 118, such as all logical 0s or all logical 1s, without receiving host data corresponding the specified data value at memory 106 from controller 108, in response to command 118. For example, controller 113 can write all the memory cells to the data state internal to memory 106 without receiving any host data at the memory cells in response to command 118.

In response to command 120, controller 113 can write host data received from controller 108 to a target group of memory cells with out pre-reading the target group. For example, all the memory cells in the target group can be previously written to the same predetermined state, such as in response to command 118, thereby avoiding the need to read the target group before writing the received host data to the target group.

In response to command 122, controller 113 can refresh the data in a target group of memory cells by writing the data values in the cells of the target group back to the cells without receiving host data from controller 108, corresponding to the data to be refreshed, at memory 106 in response to receiving command 122 from controller 108.

In some examples, the resistance variable memory cells in array 114 can have a select element (e.g., a diode, transistor, or other switching device) in series with a storage element (e.g., a phase change material, metal oxide material, and/or some other material programmable to different resistance levels). For example, the storage element may be programmed to a state corresponding a value of a fraction of a bit, a single bit, or multiple bits. The select element may be used to access the storage element in the same memory cell.

The select element may include a material, at least a portion of which, may change (e.g., switch) between a non-conductive state and a conductive state. For example, the select element may be turned on (e.g., changed from a non-conductive state to a conductive state) to access the storage element. In some examples, the select element may include a variable resistance material (e.g., phase-change material). However, the material of the select element may be such that it may operate only as a switch (e.g., not to store information) to allow access to the storage element. For example, the select element may include a chalcogenide material that may not change phase.

The storage element may include a material, at least a portion of which, may be changed (e.g., via a write operation) between different states (e.g., different material phases). The different states may have a range of different resistance values, for example, to represent different states of a memory cell. For example, the storage element may include a chalcogenide material that may be formed of various doped or undoped materials, that may or may not be a phase-change material, and that may or may not undergo a phase change during reading and/or programming the memory cell. In some examples, the storage element may include a phase change material (e.g., phase change chalcogenide alloy), such as an indium(In)-antimony(Sb)-tellurium(Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other storage element materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

In other examples, memory cells 120 may include a material, such as a phase change material, that may act as a select element and a storage element, so that memory cells 120 may act as both a selector device and a memory element. Some such cells may be referred to as self-selecting memory (SSM) cells.

Figure 2:
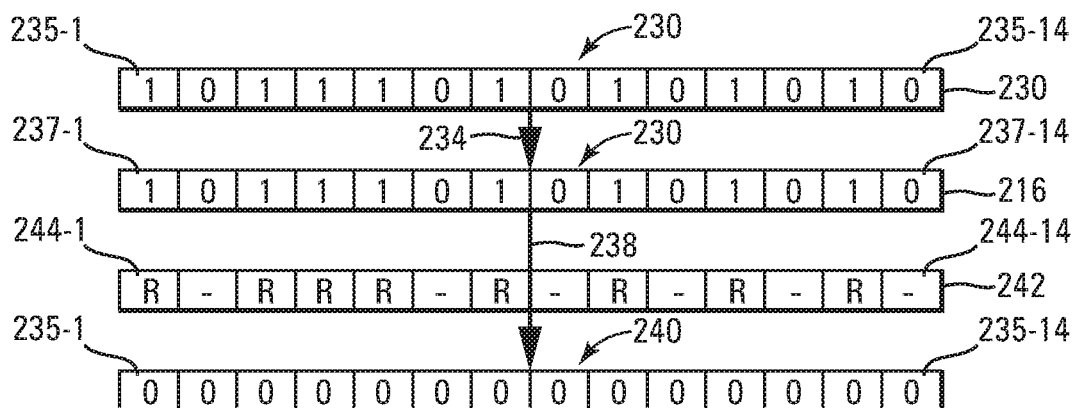
FIG. 2 illustrates data patterns associated with writing a group of resistance variable cells to common resistance state, in accordance with a number of embodiments of the present disclosure.

FIG. 2 illustrates a data pattern associated with writing a group of resistance variable cells to common resistance state, in accordance with a number of embodiments of the present disclosure. For example, FIG. 2 illustrates writing all the cells of a target group of memory cells to a common state, such as a resistance state (e.g., a reset state) corresponding to data value of a logical 0. Hereinafter, a logical 0 can refer to the resistance state corresponding to the logical 0 and a logical 1 can refer to a resistance state (e.g., a set state) corresponding to the logical 1. For example, writing a logical 0 to a cell can refer to writing the cell to the resistance state corresponding to the logical 0, and writing a logical 1 to a cell can refer to writing the cell to the resistance state corresponding to the logical 1. The cell can have a greater resistance in the reset state than in the set state, for example.

The operation in FIG. 2 can be performed by controller 113 in response to a dedicated command, such as command 118, without any external host data being received at memory 106 from controller 108, in response to the dedicated command. For example, the command can specify the address of a target group and that all logical 0s are to be written the target group. In response to the command, controller 113 can proceed with writing all logical zeros internally to memory 106 in the absence of receiving any host data from controller 108. In some examples, the command can include the address of the target group and a quantity of consecutive groups following the target group. The write only logical 0s operation described as follows can be performed for each of the consecutive groups in addition to the target group. Although the example of FIG. 2 illustrates writing all logical 0s, in other examples all logical 1s can be written.

As shown in FIG. 2, a data pattern 230 (e.g., 10111010101010), such as a management unit, is read during a read operation 234 from the target group of resistance variable memory cells 235-1 to 235-14 in array 114 to a buffer 216 that can be buffer 116. For example, data values stored memory cells 235-1 to 235-14 can be respectively read to segments 237-1 to 237-14 of buffer 216. Controller 113 can then determine any cells 235 that are at a logical 1 from the read data pattern 230 in buffer 216.

In some examples, the group of memory cells can include cells in addition to cells 235-1 to 235-14 for storing error correction (ECC) data corresponding to data pattern 230. For example, controller 113 can use the ECC data to correct the data pattern 230 during read operation 234.

A write operation 238 can then be performed to write only the cells determined to store (e.g., to be written to) logical 1s to logical 0s, resulting in the data pattern 240 of all logical 0s in the target group of resistance variable memory cells 235-1 to 235-14. In FIG. 2, reset signals R, such as voltage or current signals R, are only applied to the cells determined to store logical 1s to write (e.g., reset) those cells to logical 0s, while no voltage pulses are applied to remaining cells written to logical 0s as indicated by the dashes "-" in FIG. 2.

Applying the reset signals R only to the cells programmed to a logical 1 and not applying the reset signals R the cells programmed to a logical 0 can be the equivalent of as applying a reset mask 242 to the group of memory cells 235-1 to 235-14. Reset mask 242 has mask elements 244-1 to 244-14 respectively corresponding to memory cells 235-1 to 235-14 and buffer segments 237-1 to 237-14. The respective mask segments corresponding to the reset signals R correspond to the cells programmed to a logical 1 and indicate that a reset pulse R is to be applied to those cells. The respective mask segments containing the dash "-" indicate that the corresponding cells are prevented from getting a reset pulse R. This can reduce energy consumption and improve energy efficiency.

The write operation described in conjunction with FIG. 2 can be performed as a background operation, such as concurrently with memory 106 performing other operations, and can free up interface 111 for reading and/or writing to other portions of array 114, such as other partitions of array 114. The write operation improves the operation of memory system 102, and thus results in technical improvements to memory system 102. Avoiding the transfer of the logical zeros over interface 111 can reduce power consumption and can improve the performance of memory system 102.

Figure 3:
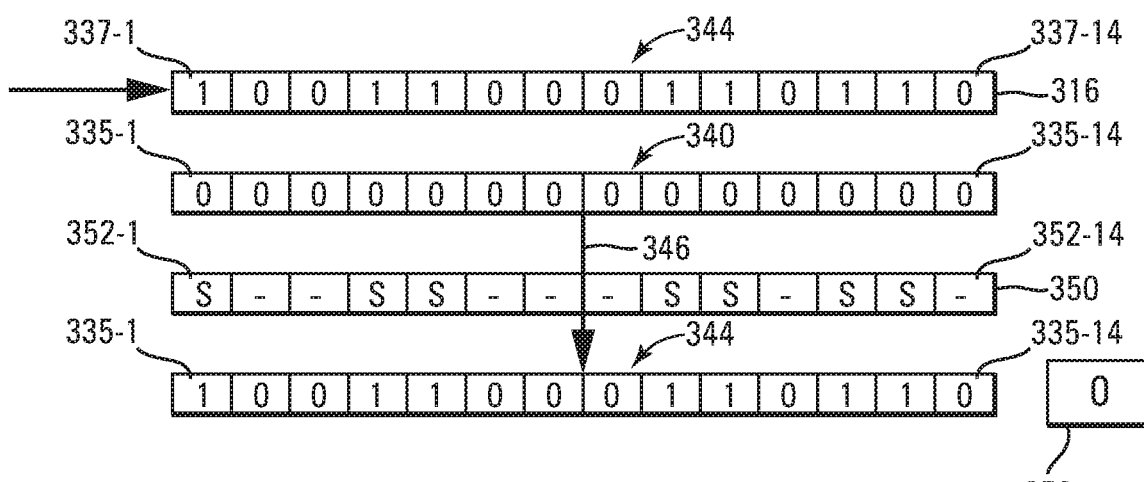
FIG. 3 illustrates data patterns associated with write without pre-read operations, in accordance with a number of embodiments of the present disclosure.

FIG. 3 illustrates data patterns associated with a write without pre-read operation, in accordance with a number of embodiments of the present disclosure. For example, FIG. 3 illustrates an example of a write without pre-read, such as in response to dedicated command 120. The write without pre-read operation can be performed internally to memory 106 by controller 113. The write without pre-read operation writes a host data pattern 344 (e.g., 10011000110110) received at a buffer 316 from controller 108 to a target group of resistance variable memory cells 335-1 to 335-14 in array 114 whose address can be specified in dedicated command 120 and that can be previously written to include a data pattern 340 of all zeros, such as in response to a command 218, as described previously in conjunction with FIG. 2. This avoids the need to pre-read the cells to determine the states of the cells.

Buffer 316 can be buffer 116 and includes buffer segments 337-1 to 337-14 that contain respective data values of data pattern 340. Buffer segments 337-1 to 337-14 respectively correspond to memory cells 335-1 to 335-14.

In some examples, in response to dedicated command 120, controller 113 can determine whether pattern 344 has more logical 1s than logical 0s. Controller 113 may perform a pattern inversion on the pattern if the pattern has more logical 1s than logical 0s, such that the previous logical 1s become logical 0s and the previous logical 0s become logical 1s. However, pattern 344 has seven logical 0s and seven logical 1s, and a pattern inversion is not warranted.

A write operation 346 writes the data pattern 344 over the data pattern 340 in place by only writing to those memory cells that are to be written to a logical 1. In FIG. 3, set signals S, such as current or voltage signals S, are only applied to the cells to be written to logical 1s to write (e.g., set) those cells to logical 1s, while no voltage pulses are applied to remaining cells to be programmed to logical 0 as indicated by the dashes "-" in FIG. 3. This can reduce energy consumption and improve energy efficiency.

An inversion indicator, such as a flag 353, can be written to indicate whether pattern 344 is an inverted pattern. For example, flag 353 can be a logical data value, such as a logical 0 to indicate no inversion or a logical 1 to indicate inversion. In the example of FIG. 3, the flag is set to a logical 0, in that the pattern 344 received from controller 108 has an equal number of logical 1s and logical 0s. In some examples, flag 353 can be stored as an extra bit in the data pattern, such as in a cell in the group of cells in addition to cells 335-1 to 335-14, although embodiments are not so limited.

Applying the set signals S only to the cells to be programmed to a logical 1 can be equivalent to applying a set mask 350 to the group of memory cells 335-1 to 335-14. Set mask 350 has mask elements 352-1 to 352-14 respectively corresponding to memory cells 335-1 to 335-14 and buffer segments 337-1 to 337-14. The respective mask segments corresponding to the set signals S correspond to the cells to be programmed to a logical 1 and indicate that a set pulse S is to be applied to those cells. The respective mask segments containing the dash "-" indicate that the corresponding cells are prevented from getting a set pulse S.

The write without pre-read operation discussed in conjunction with FIG. 3 can result in technological improvements to memory systems and their operation by reducing the latency and energy consumption associated with executing a write command that involves reading the group of memory cells before writing to the group, as is commonly done in previous approaches.

Figure 4:
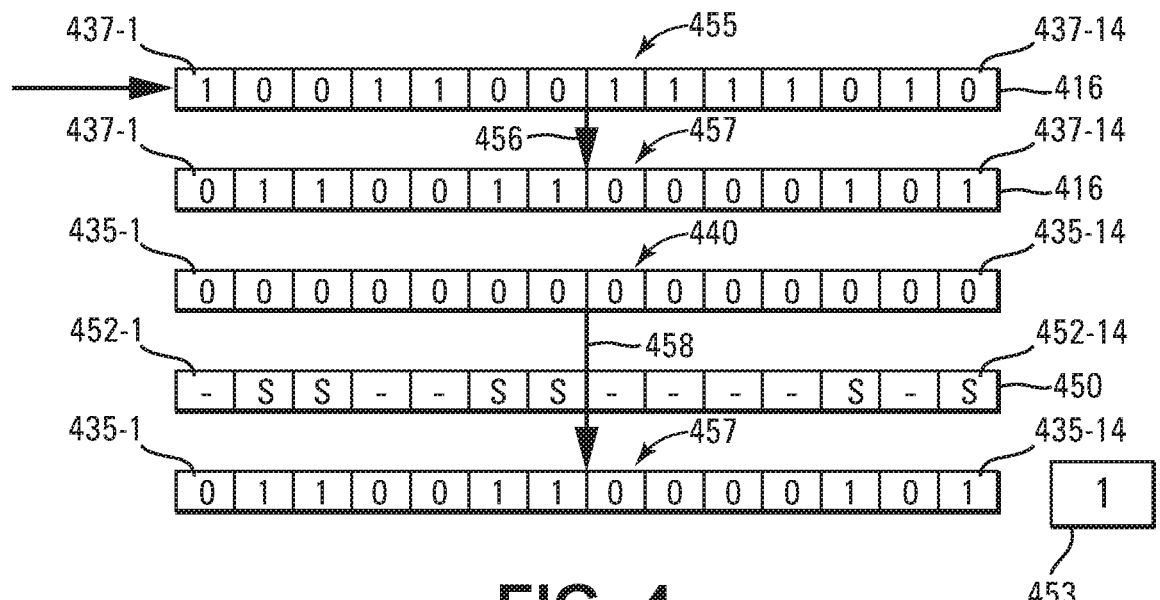
FIG. 4 illustrates data patterns associated with a write without pre-read operations with data pattern inversion, in accordance with a number of embodiments of the present disclosure.

FIG. 4 illustrates data patterns associated with a write without pre-read with a data pattern inversion, in accordance with a number of embodiments of the present disclosure. For example, FIG. 4 illustrates a write without pre-read that includes a pattern inversion, such as in response to dedicated command 120. A host data pattern 455 (e.g., 10011001111010) is received at a buffer 416 from controller 108. Buffer 416 can be buffer 116 and includes buffer segments 437-1 to 437-14 that contain respective data values of data pattern 455. Controller 113 determines that there are more logical 1s (eight) than logical 0s (six) in pattern 455, and therefore performs a pattern inversion 456 on pattern 455 in buffer 416 to create an inverted pattern 457 (e.g., 01100110000101) within buffer 416. For example, the logical 1s in pattern 455 are logical 0s in pattern 457, and the logical 0s in pattern 455 are logical 1s in pattern 457.

The write without pre-read operation writes pattern 457 to a target group of resistance variable memory cells 435-1 to 435-14 in array 114 whose address can be specified in dedicated command 120 and that can be previously written to include a data pattern 440 of all zeros, such as in response to a command 218, as described previously in conjunction with FIG. 2. Memory cells 435-1 to 435-14 respectively correspond to buffer segments 437-1 to 437-14, for example. Controller 113 can avoid the need to pre-read memory cells 435-1 to 435-14 to determine the states of memory cells 435-1 to 435-14 prior to writing pattern 457 to a memory cells 435-1 to 435-14, in that controller 113 knows the group of memory cells 435-1 to 435-14 stores pattern 440.

A write operation 458 writes the data pattern 457 over the data pattern 440 in place by only writing to those memory cells that are to be written to a logical 1. In FIG. 4, set signals S are only applied to the cells to be written to logical 1s to write those cells to logical 1s, while no voltage pulses are applied to remaining cells to be programmed to logical 0 as indicated by the dashes "-" in FIG. 4. A flag 453 is set to a logical 1 to indicate that pattern 457 has been inverted and is the inverse of pattern 455 received from controller 108.

A set mask 450 that has mask elements 452-1 to 452-14 respectively corresponding to memory cells 435-1 to 435-14 and buffer segments 437-1 to 437-14 can be effectively applied to the group of memory cells 435-1 to 435-14 so that the set signals S are only applied to the cells to be programmed to a logical 1 and the set signals S are prevented from being applied to the cells to remain as logical 0s, and indicated by the dashes "-."

Figure 5:
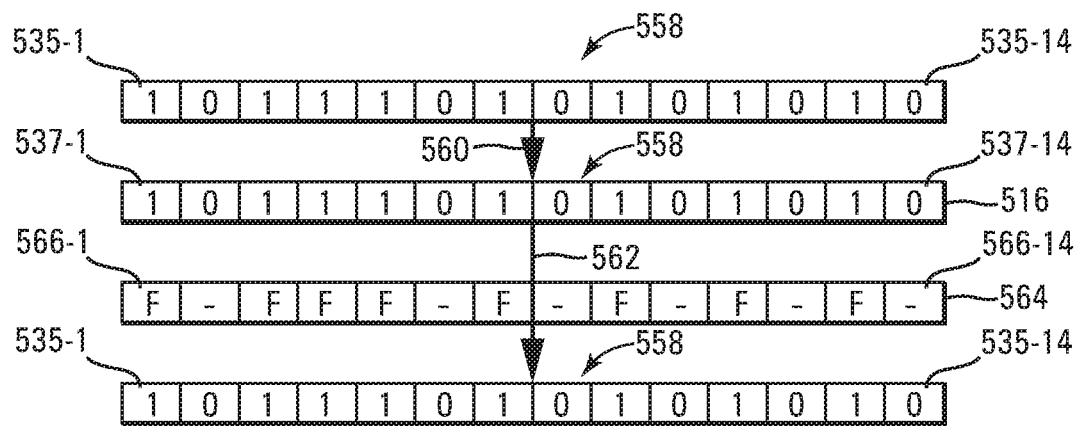
FIG. 5 illustrates data patterns associated with refresh operations, in accordance with a number of embodiments of the present disclosure.

FIG. 5 illustrates data patterns associated with a refresh operation, in accordance with a number of embodiments of the present disclosure. For example, the refresh operation can be in response to dedicated command 122. Controller 113 can perform the refresh operation in FIG. 5 on a target group of cells, whose address can be specified in command 122, without any host data being received at memory 106 from controller 108 in response to dedicated command 122. In some examples, the address might not be specified in command 122. For example, controller 113 can be responsible for determining which groups of cells to refresh in response to command 122 based on the when the groups were last refreshed. In some examples, the controller 113 can refresh all of array 114 in response to command 122. In some examples, the command can include the address of the target group and a quantity of consecutive groups following the target group. The refresh operation described as follows can be performed for each of the consecutive groups in addition to the target group. Although the example of FIG. 5 illustrates refreshing only cells storing logical 1s, in other examples only cells storing logical 0s can be refreshed or cells storing logical 0s and cells storing logical 1s can be refreshed.

In FIG. 5, a data pattern 558 (e.g., 10111010101010) is read during a read operation 560 from the target group of resistance variable memory cells 535-1 to 535-14 in array 114 to a buffer 516 that can be buffer 116. Data values stored memory cells 535-1 to 535-14 can be respectively read to segments 537-1 to 537-14 of buffer 516. Controller 113 can then determine any cells 535 that are written to a logical 1 from the read data pattern 558 in buffer 516. A refresh operation 562 can then be performed to refresh only the cells determined to store logical 1s back to logical 1s, resulting in the refreshed data pattern 558.

In some examples, the group of memory cells can include cells in addition to cells 535-1 to 535-14 for ECC data corresponding to data pattern 558. For example, controller 113 can use the ECC data to correct the data pattern 558 during read operation 560.

In FIG. 5, voltage pulses, such as refresh voltage pulses F, are only applied to the cells determined to store logical 1s to refresh those cells to logical 1s, while no voltage pulses are applied to remaining cells storing logical 0s as indicated by the dashes "-" in FIG. 5. For example, the cells storing logical 0s might have drifted to different resistance states with time. This can make it difficult to read the cells with the same read voltage. In the example of FIG. 5, applying refresh pulse F to the cells that store logical 1s can result in those cells having about the same (e.g., the same) resistive state and thus can mitigate the problems associated with drift.

A refresh mask 564 that has mask elements 566-1 to 566-14 respectively corresponding to memory cells 535-1 to 535-14 and buffer segments 537-1 to 537-14 can be effectively applied to the group of memory cells 535-1 to 535-14 so that the refresh pulses F are only applied to the cells that store logical 1s and the refresh pulses F are prevented from being applied to the cells that store logical 0s, as indicated by the dashes "-."

Figure 6A:
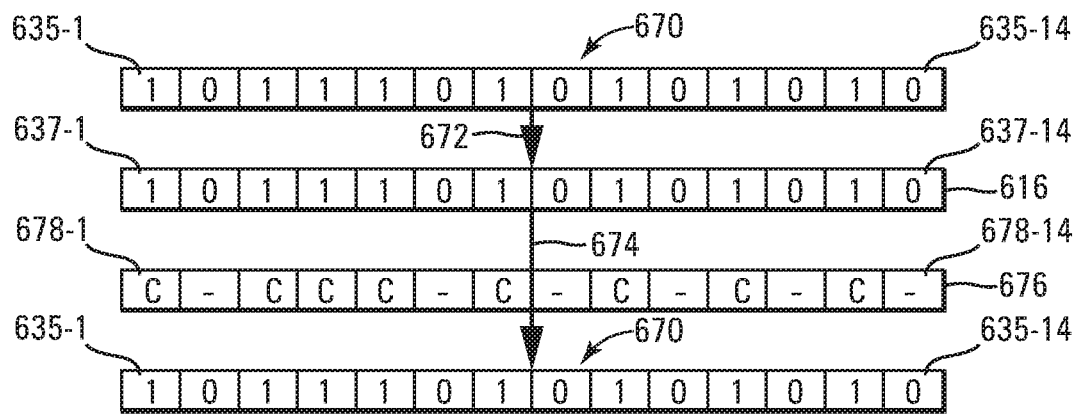
FIG. 6A illustrates data patterns associated with cyclic refresh operations, in accordance with a number of embodiments of the present disclosure.

FIG. 6A illustrates data patterns associated with a cyclic refresh operation, in accordance with a number of embodiments of the present disclosure. For example, the cyclic refresh operation can be performed in response to dedicated command 122. Controller 113 can perform the refresh operation in FIG. 6A on a target group of cells, whose address can be specified in command 122, without any host data being received at memory 106 from controller 108 in response to dedicated command 122. In some examples, the command can include the address of the target group and a quantity of consecutive groups following the target group. The refresh operation described as follows can be performed for each of the consecutive groups in addition to the target group. Although the example of FIG. 6A illustrates refreshing only cells storing logical 1s, in other examples only cells storing logical 0s can be refreshed or cells storing logical 0s and cells storing logical 1s can be refreshed.

In FIG. 6A, a data pattern 670 (e.g., 10111010101010) is read during a read operation 672 from the target group of resistance variable memory cells 635-1 to 635-14 in array 114 to a buffer 616 that can be buffer 116. Data values stored memory cells 635-1 to 635-14 can be respectively read to segments 637-1 to 637-14 of buffer 616. Controller 113 can then determine any cells 635 that are written to a logical 1 from the read data pattern 670 in buffer 616. A cyclic refresh operation 674 can then be performed to refresh only the cells of cells 635-1 to 635-14 determined to store logical 1s back to logical 1s, resulting in the refreshed data pattern 670.

In some examples, the group of memory cells can include cells in addition to cells 635-1 to 635-14 for ECC data corresponding to data pattern 670. For example, controller 113 can use the ECC data to correct the data pattern 670 during read operation 672.

A cyclic refresh mask 676 that has mask elements 678-1 to 678-14 respectively corresponding to memory cells 635-1 to 635-14 and buffer segments 637-1 to 637-14 can be effectively applied to the group of memory cells 635-1 to 635-14 so that cyclic refresh operations C are only applied to the cells that store logical 1s and the cyclic refresh operations C are prevented from being applied to the cells storing logical 0s, as indicated by the dashes "-."

Figure 6B:
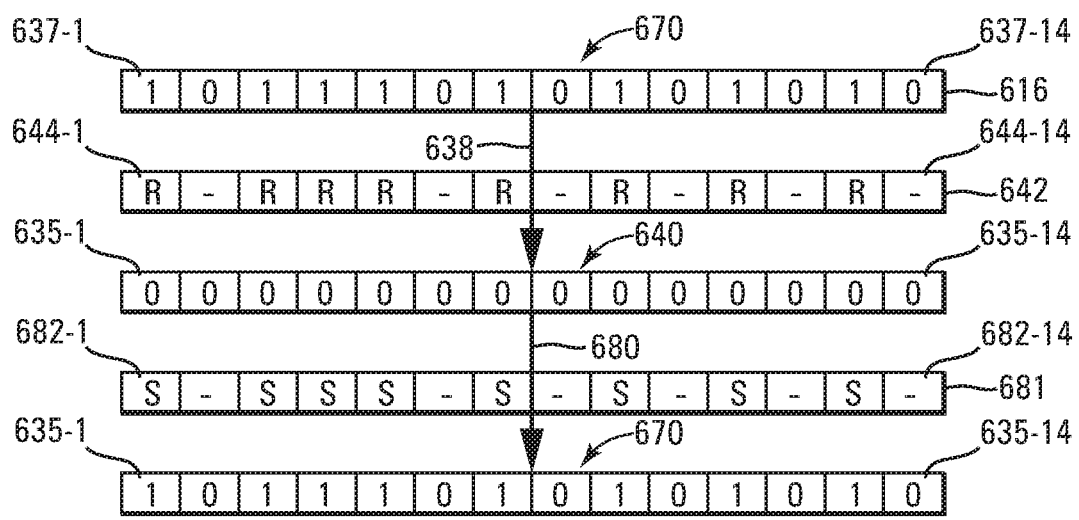
FIG. 6B illustrates data patterns associated with writes during cyclic refresh operations, in accordance with a number of embodiments of the present disclosure.

FIG. 6B illustrates data patterns associated with writes during a cyclic refresh, in accordance with a number of embodiments of the present disclosure. For example, FIG. 6B illustrates an example of the writes during the cyclic refresh 674 in FIG. 6A. Cyclic refresh operation 674 can include a write operation 638, such as a reset operation, that applies reset signals R to only the cells of cells 635-1 to 635-14 determined to store logical 1s to write those cells to logical 0s to create the data pattern 640 of all logical 0s so that each of cells 635-1 to 635-14 stores a logical 0. For example, a reset mask 642 that has mask elements 644-1 to 644-14 respectively corresponding to memory cells 635-1 to 635-14 and buffer segments 637-1 to 637-14 can be effectively applied to the group of memory cells 635-1 to 635-14 so that reset signals R are only applied to the cells that store logical 1s and reset signals R are prevented from being applied to the cells that store logical 0s, as indicated by the dashes "-."

Cyclic refresh operation 674 can include a write operation 638, such as a reset operation, that applies reset signals R to only the cells of cells 635-1 to 635-14 determined to store logical 1s to write those cells to logical 0s to create the data pattern 640 of all logical 0s so that each of cells 635-1 to 635-14 stores a logical 0. For example, a reset mask 642 that has mask elements 644-1 to 644-14 respectively corresponding to memory cells 635-1 to 635-14 and buffer segments 637-1 to 637-14 can be effectively applied to the group of memory cells 635-1 to 635-14 so that reset signals R are only applied to the cells to be programmed to a logical 1 and reset signals R are prevented from being applied to the cells programmed logical 0s, as indicated by the dashes "-."

Cyclic refresh operation 674 can include a write operation 680, such as a set operation. Write operation 680 writes the data pattern 670 over the data pattern 640 in place by only writing to those memory cells that are to be written to a logical 1. In FIG. 6B, set signals S are only applied to the cells to be written to logical 1s to set those cells to logical 1s, while no voltage pulses are applied to remaining cells to be remain at logical 0s as indicated by the dashes "-." For example, a set mask 681 that has mask elements 682-1 to 682-14 respectively corresponding to memory cells 635-1 to 635-14 and buffer segments 637-1 to 637-14 can be effectively applied to the group of memory cells 635-1 to 635-14 so that set signals S are only applied to the cells to be programmed to a logical 1 and set signals S are prevented from being applied to the cells to remain at logical 0s, as indicated by the dashes "-."

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
    a memory comprising an array of resistance variable memory cells; and
    a controller configured to:
        receive a dedicated command to write all cells in a number of groups of the resistance variable memory cells to a first state without transferring a data pattern corresponding to the first state to the number of groups; and
        in response to the dedicated command:
            perform a read operation on each respective group to determine states of the cells in each respective group;
            determine from the read operation those cells in each respective group programmed to a second state; and
            write only the cells determined to be in the second state to the first state.

2. The apparatus of claim 1, wherein the controller is a first controller and is internal to the memory, and wherein the dedicated command is received from a second controller that is external to the memory via a memory interface.

3. The apparatus of claim 2, wherein no data pattern corresponding to the first state is transferred from the second controller in response to the dedicated command.

4. The apparatus of claim 2, wherein the read operation is performed without receiving a read command from the second controller.

5. The apparatus of claim 1, wherein the first state corresponds to a higher resistance level than the second state.

6. The apparatus of claim 1, wherein the first state corresponds to a first data value and the second state corresponds to a second data value.

7. The apparatus of claim 1, further comprising generating a reset mask pattern based on the read operation.

8. The apparatus of claim 1, wherein the controller is configured to write only the cells determined to be in the second state to the first state by applying a reset signal to only the cells determined to be in the second state.

9. The apparatus of claim 1, wherein the dedicated command comprises an address of a particular group of the number of groups and a quantity of consecutive groups of the number of groups following the particular group.

10. A method comprising:
    in response to receiving, to a memory from a controller that is external to the memory, a first dedicated command to write all cells in a number of groups of resistance variable memory cells to a first state, changing, to the first state, only those cells currently in a second state;
    wherein the first dedicated command does not comprise a user data pattern; and
    after all the cells in the number of groups are in the first state, writing, in response to a second dedicated command received to the memory from the controller, a user data pattern to a target group of the number of groups without first determining the states of the target group.

11. The method of claim 10, wherein changing, to the first state, only those cells currently in the second state comprises applying reset signals to only the cells in the second state.

12. The method of claim 10, wherein writing the user data pattern to the target group comprises applying write signals only to cells that are to be written to the second state.

13. The method of claim 12, further comprising applying set signals to only the cells that are to be written to the second state.

14. The method of claim 10, further comprising:
    determining whether a host data pattern comprises more data values corresponding to the second data state than the first data state; and
    responsive to determining that the host data pattern comprises more data values corresponding to the second data state than the first data state, performing pattern inversion prior to storing the host data pattern in the target group so that data values previously corresponding to the second data state correspond to the first data state and data values previously corresponding to the first data state correspond to the second data state.

15. The method of claim 14, further comprising setting a flag indicating that the target group stores inverted data.

16. The method of claim 10, further comprising storing a mask corresponding to the user data pattern in a buffer in response to the second dedicated command before writing host data pattern to the target group.

17. The method of claim 16, further comprising:
    reading the buffer; and
    applying set signals to cells based on the mask.

18. An apparatus, comprising:
    a memory comprising an array of resistance variable memory cells; and a controller coupled to the memory, wherein the controller is configured to:
  receive a dedicated refresh command to refresh a target group of target cells of the resistance variable memory cells without transferring a data pattern to the target group of cells in response to the refresh command; and
  in response to the dedicated refresh command:
    perform a read operation on the target group to determine states of the target cells; and
    rewrite only those target cells determined to be programmed to a particular state.

19. The apparatus of claim 18, wherein the particular state is a first state, and
  wherein the controller is configured to rewrite the target cells by:
    writing the target cells to a second state from the first state; and
    writing the target cells back to the first state from the second state.

20. The apparatus of claim 19, wherein the first state corresponds to a higher resistance level than the second state.

21. The apparatus of claim 19, wherein
  writing the target cells to the second state from the first state comprises applying a reset signal to the target cells in the first state; and
  writing the target cells back to the first state from the second state comprises applying a set signal to the cells in the second state.

22. The apparatus of claim 18, wherein the controller is internal to the memory, and wherein the refresh command is received from a controller external to the memory via a memory interface.

23. The apparatus of claim 22, wherein no data pattern to be stored in the memory is transferred from the controller external to the memory to the memory in response to the refresh command.

24. The apparatus of claim 22, wherein the controller internal to the memory is configured to use error correction data stored in the target group to correct data corresponding to the states of the target cells determined during the read operation before rewriting only the target cells determined to be programmed to the particular state back to the particular state.

25. An apparatus, comprising:
  a first controller;
  a memory coupled to the first controller, the memory comprising:
    an array of resistance variable memory cells; and
    a second controller coupled to the array, wherein the second controller is configured to:
      in response to a first dedicated command from the first controller, write only cells in a number of groups of the resistance variable memory cells in a first state to a second state without transferring a data pattern corresponding to the second state from the first controller to the second controller; and
      after all the cells in the number of groups are in the second state, write, in response to a dedicated second command from the memory controller, a data pattern to a target group of the number of groups without first determining states of the target group.

26. The apparatus of claim 25, wherein the dedicated second command indicates to the second controller that the data pattern is to be written to the target group without first determining the states of the target group.

27. The apparatus of claim 25, wherein the first controller comprises a memory system controller external to the memory and is coupled to a host via a host interface, and wherein the second controller is a device embedded controller coupled to the memory system controller via a memory interface.

* * * * *